(12) United States Patent
Bergeron (10) Patent No.: US 7,191,165 B2
(45) Date of Patent: Mar. 13, 2007

(54) TRANSACTION BASED DESIGN VERIFICATION WITH HIERARCHICAL VERIFICATION COMPONENTS

(75) Inventor: Janick Bergeron, Ontario (CA)

(73) Assignee: Synopsys, Inc., Mountain View, CA (US)

( * ) Notice: Subject to any disclaimer, the term of this patent is extended or adjusted under 35 U.S.C. 154(b) by 275 days.

(21) Appl. No.: 09/874,891

(22) Filed: Jun. 4, 2001

(65) Prior Publication Data

US 2002/0184185 A1   Dec. 5, 2002

(51) Int. Cl.
*G06F 17/30* (2006.01)

(52) U.S. Cl. .......................................... 707/1

(58) Field of Classification Search ................ 707/100, 707/1, 2, 104.1; 709/318; 714/41
See application file for complete search history.

(56) References Cited

U.S. PATENT DOCUMENTS

| 5,592,342 A | * | 1/1997 | Hall et al. ..................... 360/48 |
| 5,835,602 A | * | 11/1998 | Lang .......................... 380/268 |
| 6,044,211 A | * | 3/2000 | Jain ............................. 716/18 |
| 6,631,481 B1 | * | 10/2003 | Hoard et al. ................... 714/41 |
| 2002/0123873 A1 | * | 9/2002 | Roesner et al. ............... 703/17 |
| 2002/0147858 A1 | * | 10/2002 | Motoyama et al. ......... 709/318 |
| 2003/0111300 A1 | * | 6/2003 | Schuster ..................... 187/391 |

OTHER PUBLICATIONS

Publication entitled "Reuse of Configurable Stacked-Protocol Utilities for Verification of Datacom ASICS", by Serag GadelRab et al., 1999 Digital Communications Design Conference, XP008023283.

* cited by examiner

*Primary Examiner*—Etienne P. LeRoux
(74) *Attorney, Agent, or Firm*—Park, Vaughan & Fleming, LLC (57) ABSTRACT

A library of data structures is disclosed. These data structures will be used in verification components during the verification process of a device. The data structures are utilized to perform the tasks such as generating data objects, applying data objects to a design under verification, monitoring a physical interface, extracting data objects from a physical interface, and data checking objects. Additionally, the ability to utilize existing verification components as constituent elements to construct other verification components is disclosed.

18 Claims, 9 Drawing Sheets

```
unit my_sonet_gen {
    phy             : sonet_phy_tx;                              910
    pack_3_12       : sonet_pack;
    sts_3c[3]       : list of sonet_gen;
    pack_1_3        : sonet_pack;
    sts_1[3]        : list of sonet_gen;

keep phy.n                = 12;                              920
    keep pack_3_12.out_n      = phy.n;                           922
    keep pack_3_12.in_n       = 3;                               924
    keep for each (sts) in sts_1 {
        sts.n = 1;
    };

keep pack_1_3.out_n       = pack_3_12.in_n;
    keep pack_1_3.in_n        = 1;
    keep for each (sts) in sts_1 {
        sts.n_3;
    };

// connections...
    keep pack_3_12.out_mbox   = phy.in_mbox;                           ⎫
    keep sts_3c[0].out_mbox   = pack_3_12.in_mbox[0];                  ⎪
    keep sts_3c[1].out_mbox   = pack_3_12.in_mbox[1];                  ⎬ 990
    keep pack_1_3.out_mbox    = pack_3_12.in_mbox[2];                  ⎪
    keep sts_3c[2].out_mbox   = pack_3_12.in_mbox[3];                  ⎭
    keep for each (sts) in sts_1 {
        sts.out_mbox = pack_1_3.in_mbox[.index];
    };
};
```

Figure 9

TRANSACTION BASED DESIGN VERIFICATION WITH HIERARCHICAL VERIFICATION COMPONENTS

FIELD OF THE INVENTION

The present invention is related to the field of data processing. In particular, this invention has to do with electronic design automation.

BACKGROUND OF THE INVENTION

Design verification has traditionally been second tier to design creation. Early on, a majority of a design cycle was spent on the creation of a design. Verification was performed on an "as needed" basis and typically only for critical portions of a design; verification was rarely performed on a complete design. Design verification was resultantly a small portion of a project's time and finance budget. As a result of a number of factors, it became apparent that more effort was need on the verification portion of a product development cycle.

Concurrent with this realization of the need for greater verification efforts in product development cycles, great strides were being made in efficiency of the design portion of the cycle through paradigm shifts. Unfortunately, while the realization of the need for verification arrived, the verification paradigm did not make the same strides in efficiency as did the design paradigm.

The verification approach to designs involved several methods. One was a brute force, exercise all pins method. This approach involves exercising every combination of inputs to a design and observing the outputs. This approach has several drawbacks. First, it requires 2 to the n vectors, where n is the number of input pins. Second, it does not take into account state behavior of the device. Third, it will likely result in redundant testing of some portion of the design.

A second solution was to write custom models for testing, at least portions of, devices under verification. This, however, also has drawbacks. First, this solution requires knowledge of details of the implementation down to the pin level. Second, it may result in duplicated efforts when a design reuses portions of an existing design.

What has resulted from these solutions is a typical design scenario where the verification resources are reaching 70% of the total project resource pool. What is desired is a more efficient verification approach.

DETAILED DESCRIPTION OF THE INVENTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Overview

One solution to overcome the limitations in traditional verification environments is to provide a transaction based verification environment. To further enhance a transaction based verification environment, the present invention provides the ability to develop "hierarchical" transactional models through stackable verification components with intercomponent communication.

Providing a transaction based verification environment raises the level at which the verification engineer needs to think from the signal level to the transaction level. This can be accomplished by utilizing a number of commercially available test bench generation tools such as Specman Elite from Verisity.

Even with the ability to raise the level of abstraction to a transactional level, there is still the need of the verification engineer to develop transactional models. For example, the engineer may develop a model that provides a SONET STS 1 frame to a device under verification. The test bench generation software would handle the writing of the detailed, pin level test bench stimulus. However, what if one wants to simulate multiplexing 3 STS 1 frames into a signal STS 3 frame? If one already has the STS 1 model written, ideally one would merely need to write an STS 3 "packer". That is, one would desire a model that will receive data for 3 STS 1 frames and put them together into an STS-3 frame. The present invention advantageously enables the verification engineers to do so, leveraging on existing interoperable and stackable verification components.

Definitions

The following abbreviations are used in the description of the present invention.

ATM—Asynchronous Transfer Mode
VC—Verification Component
SONET—Synchronous Optical Network
SPE—Synchronous Payload Envelope
STS—Synchronous Transport Signal
UNI—User to Network Interface
NNI—Network Node Interface
MII—Media Independent Interface
IP—Internet Protocol Advantages Transaction based design verification, using the verification components of the present invention, provides several advantages to the verification effort vis-a-vis traditional verification techniques. The first advantage is reusability. The verification components do not require or infer a specific architecture for the design under verification. Another advantage is configurability. A single verification component implements all flavors of a particular protocol and offers controllability of all fields in the data structures. A further advantage of the verification components is interoperability. Protocols and their corresponding verification components can be stacked to model complex communication systems at various layers or abstraction. Finally, the verification components are designed to be easy to understand and maintain.

Verification Component (Function) Types

In accordance with the present invention, verification components provide one of three fundamental functions for the verification of a design. The first function is a generator, the second is a monitor and the third is a checker.

Figure 1:
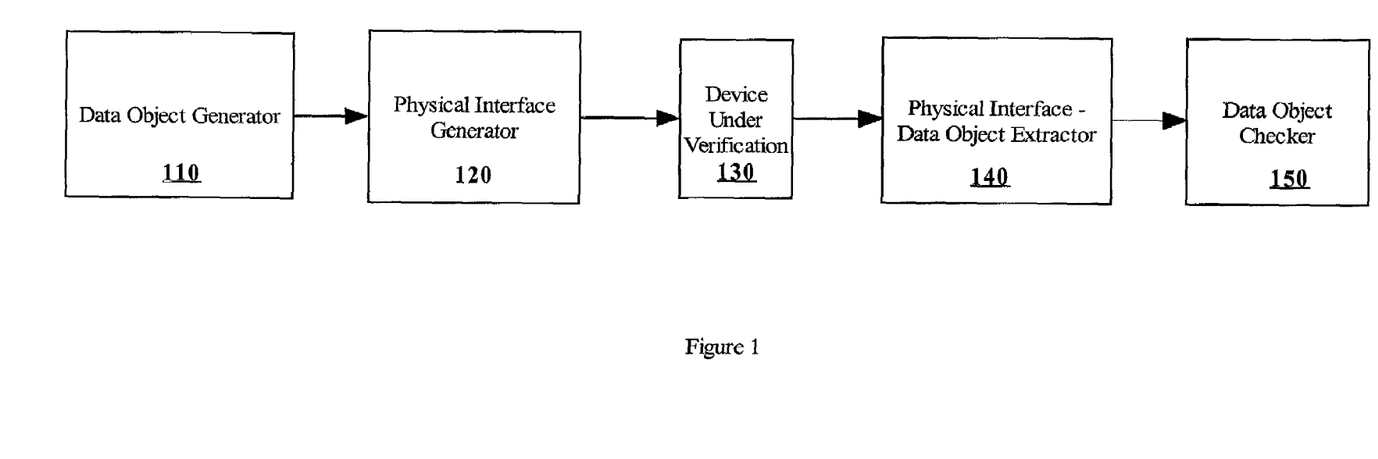
FIG. 1—An embodiment of a verification of a device using the methodology of the present invention.

FIG. 1 shows an embodiment of a verification of a device using the "three functions" verification component methodology of the present invention. Data Object Generator 110 will generate data objects that are to be used in the verification of the device 130. For example, the data object generator may generate SONET STS 1 frames. The Physical Interface Generator 120 will take the STS 1 frames and generate the physical interface to be applied to the device under verification 130. The response of the device under verification 130 is also monitored in this embodiment. The Physical Interface Data Object Extractor 140 will monitor the physical interface of the device under verification and extract data objects. These extracted data objects are verified by the Data Object Checker 150.

Hierarchical (Stacked) Verification Component Constituent Elements

Figure 2:
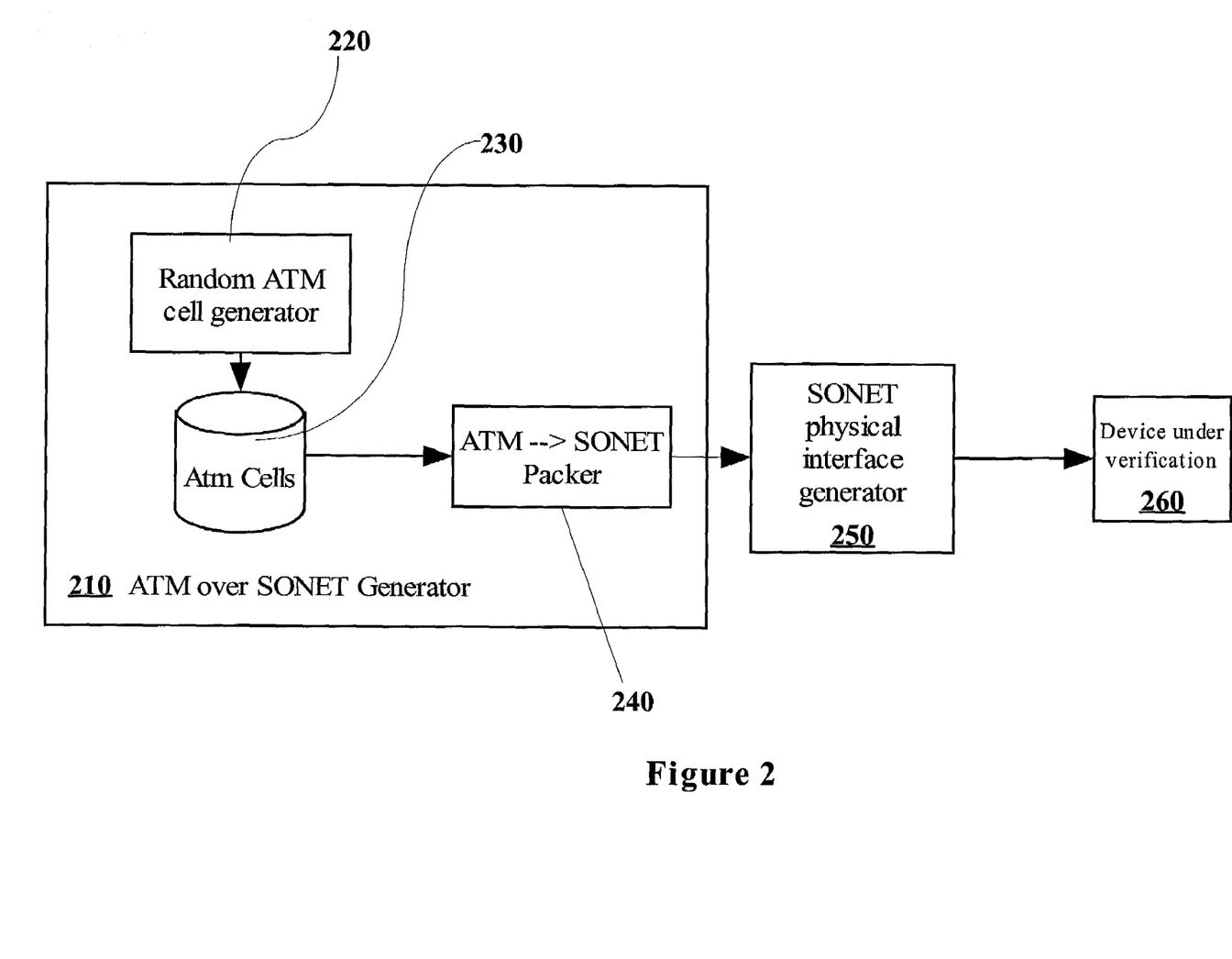
FIG. 2—Embodiment showing lower level constituent verification elements to generate higher level verification object.

In accordance with the present invention, "higher level" verification components are built from lower level constituent elements. These lower level components, themselves verification components, can be combined to perform the verification component functions listed above. FIG. 2 shows an example of such a higher-level component. Here a random ATM cell over SONET generator verification component 210 will be comprised of a structure representing ATM cells 230, a random ATM cell generator 220 to populate these structures and an ATM to SONET packer 240. Thus, three types of constituent verification elements are data object structures, random generators and packers. Also shown in FIG. 2 are a SONET to physical interface generator 250 and the device to be verified by this verification environment 260.

The data object structures represent the data being transported by a protocol. For example, to facilitate the transportation of an IP packet there will exist an IP data structure. Other types of data that will have data objects include Ethernet frames, ATM cells and SONET frames. Note that a data object may have variants where variants are supported by the protocol. For example, the ATM standard supports UNI and NNI cell variants. Resultantly, there will be UNI and NNI data structure objects. Other examples of variant data objects are MII/IEEE 802 Ethernet frames and STS 3/STS 3c SONET frames.

Random generators are components that can generate random data for objects supported by a protocol. For example, a random IP generator will generate random IP packets for use in populating an IP data object structure. In one embodiment, random generators can exist for any protocol supported by a data object structure. In another embodiment, a generator exists for processing unit instructions.

The present invention supports several types of physical interface units as constituent elements to VCs. These include physical interface stimulus units, physical interface active response units and physical interface passive response units. These components are bus functional models for the protocols that they are to support.

Physical interface stimulus units are bus-functional models whose primary function is to provide stimulus or inputs to the design under verification. In complex interfaces, however, the physical interface stimulus unit appropriately monitors feedback from the design under verification. In addition, these models may provide the necessary controls to introduce errors in the protocol. In one embodiment, meta-data is generated that describes a specific error to be injected at a specific point in the transaction. The meta-data is then attached to the physical interface stimulus unit such that the error is injected during transmission. Examples of physical interface stimulus units include PCI masters, SONET generators and Utopia physical-layer transmitters.

Physical interface active response units are bus functional models whose primary purpose is to monitor the response or outputs of the design under verification. In complex interfaces, however, feedback to the design under verification is appropriately generated. The physical interface active response unit may also provide the necessary controls to introduce errors in the protocol. Examples of physical interface active response units are PCI slaves, SONET terminators and Utopia physical layer receivers.

Physical interface passive response units are also bus functional models whose primary responsibility is to monitor the response or outputs of the design under verification. However, unlike the active response units, these units do not provide any feedback when used with complex interfaces. This type of unit is used to monitor the data and protocol flowing between two design components. It may provide the necessary controls to inject errors or interfere in the protocol. Examples of physical interface passive response units are PCI cycle monitors and Ethernet packet sniffers.

In one embodiment, a physical interface response unit contains a protocol-checking unit. In this manner, the physical interface response unit, in addition to populating the appropriate data object structure for the physical protocol being monitored, will check to determine if there is a violation of the physical protocol.

In one embodiment, two other constituent elements are further utilized in the generation of hierarchical (stacked) verification components; Data Object Packing Units and Data Object Unpacking Units. Data Object Packing Units take as input one or more data object structures and multiplex or pack them into another object of a different type. The user can constrain the control fields of the new data object.

Examples of data object packing unit are ATM cell over SONET packers and TCP/IP over Ethernet packers. Data Object Unpacking Units perform the inverse function. That is, they extract data objects of a particular type from another object of a different type. The user can then compare the extracted values in the resulting data object structure with the expected value. Examples of the unpacking would be reassembly of ATM cells from SONET frames or TCP/IP data from Ethernet frames.

Data Object Generation

Figure 3:
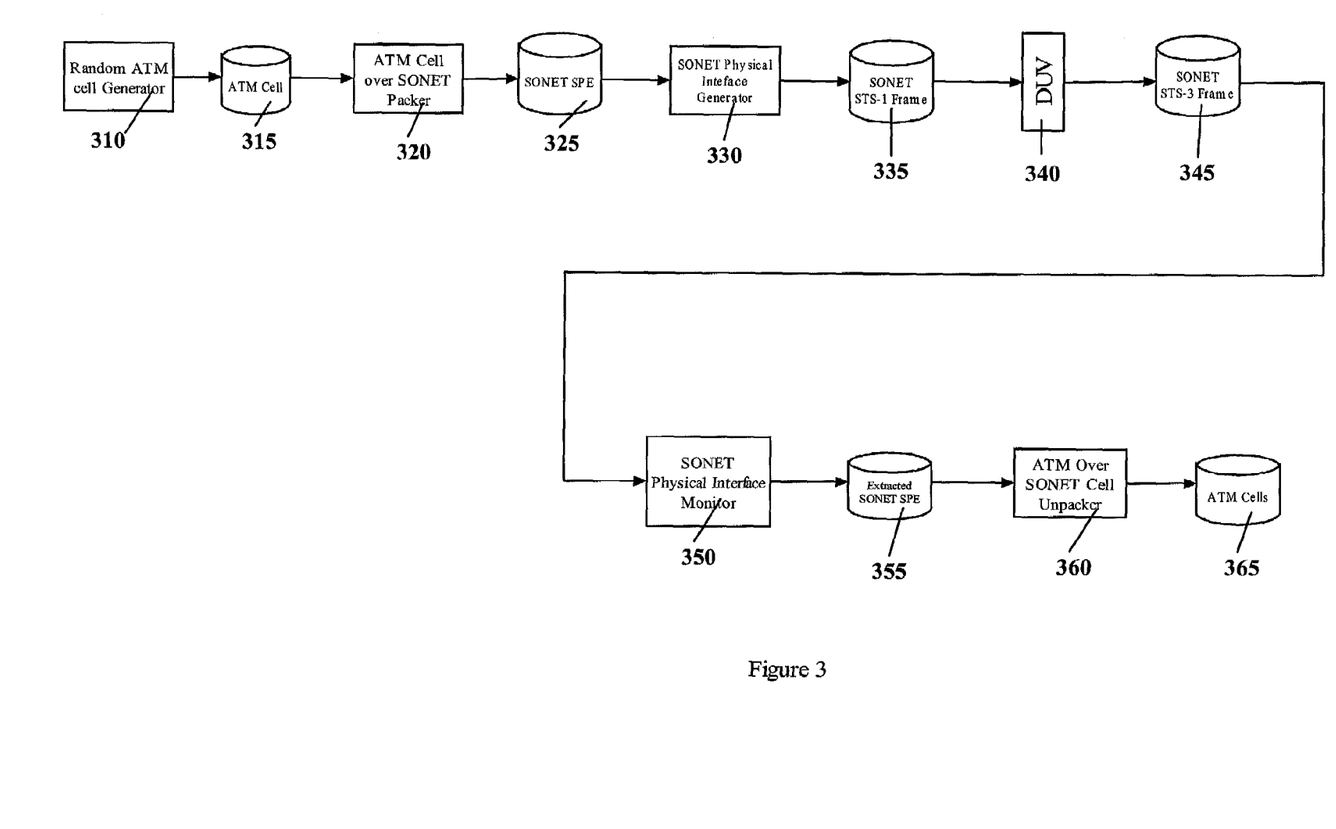
FIG. 3—Embodiment for verification of an STS-1 to STS-3 conversion device.

As can be seen with the present invention, data objects may be generated in various manners. In one embodiment of the present invention, a SONET frame may be generated by a random SONET frame generator. In another embodiment, a SONET frame may be generated by an ATM to SONET packer. FIG. 3 shows an embodiment of the utilization of this present invention to verify a SONET STS-1 to STS-3 conversion device. It is desired in this embodiment to verify that ATM cells can be transferred through the device under verification without altering the ATM data. First, a random ATM cell generator 310 is utilized to generate ATM cells 315. The ATM cells 315 are then packed via a data object packing unit 320 into an SPE 325. This SPE is then converted to a STS-1 frame 335 by a physical interface stimulus unit 330 that generates the SONET STS-1 frames.

These frames are applied to the device under verification 340. In this case, the device under verification will be generating high rate STS-3 frames 345 from the STS-1 frames. The STS-3 frame 345 will be monitored by the SONET Physical Interface Monitor 350. In this embodiment, the physical interface monitor will decode the STS-3 frame to generate a SONET SPE 355. Finally, in this embodiment, the ATM cells 365 will be "unpacked" from the SONET SPE by the ATM over SONET cell unpacker 360.

Figure 4:
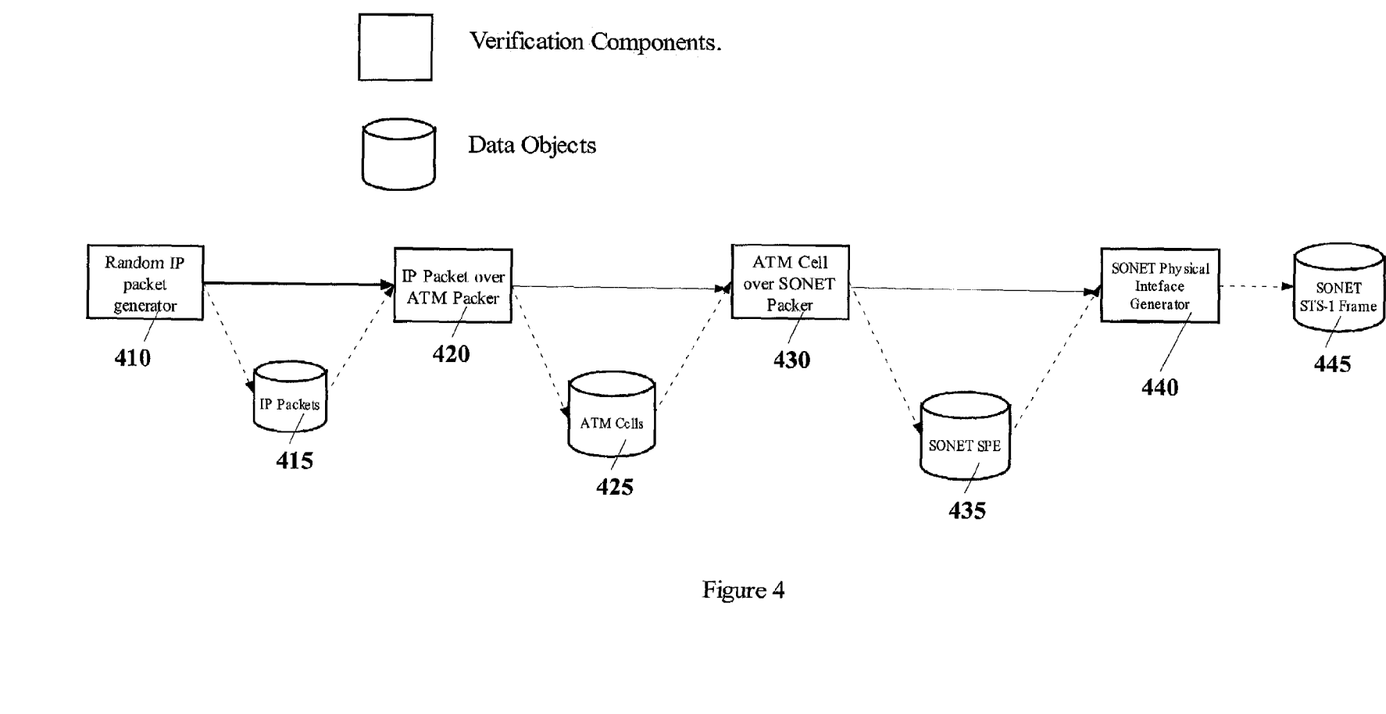
FIG. 4—Embodiment showing the testing of IP packets in SONET frames.

The ability to combine protocols and technologies in a modularized fashion is enabled by the present invention. For example, in one embodiment of the present invention as shown in FIG. 4, a user can generate a SONET frame from IP packets. However, the path to get to a SONET frame from IP packet is not direct. First, a random IP pack generator 410 generates IP packets 415. Next, an IP over ATM packer 420 converts IP packets 415 to ATM cells 425. Then, an ATM over SONET packer 430 converts the ATM cells to SONET SPEs 435. Finally, the SPEs are converted into SONET frames. At this point, the SONET frames are applied to a device under verification.

Figure 5:
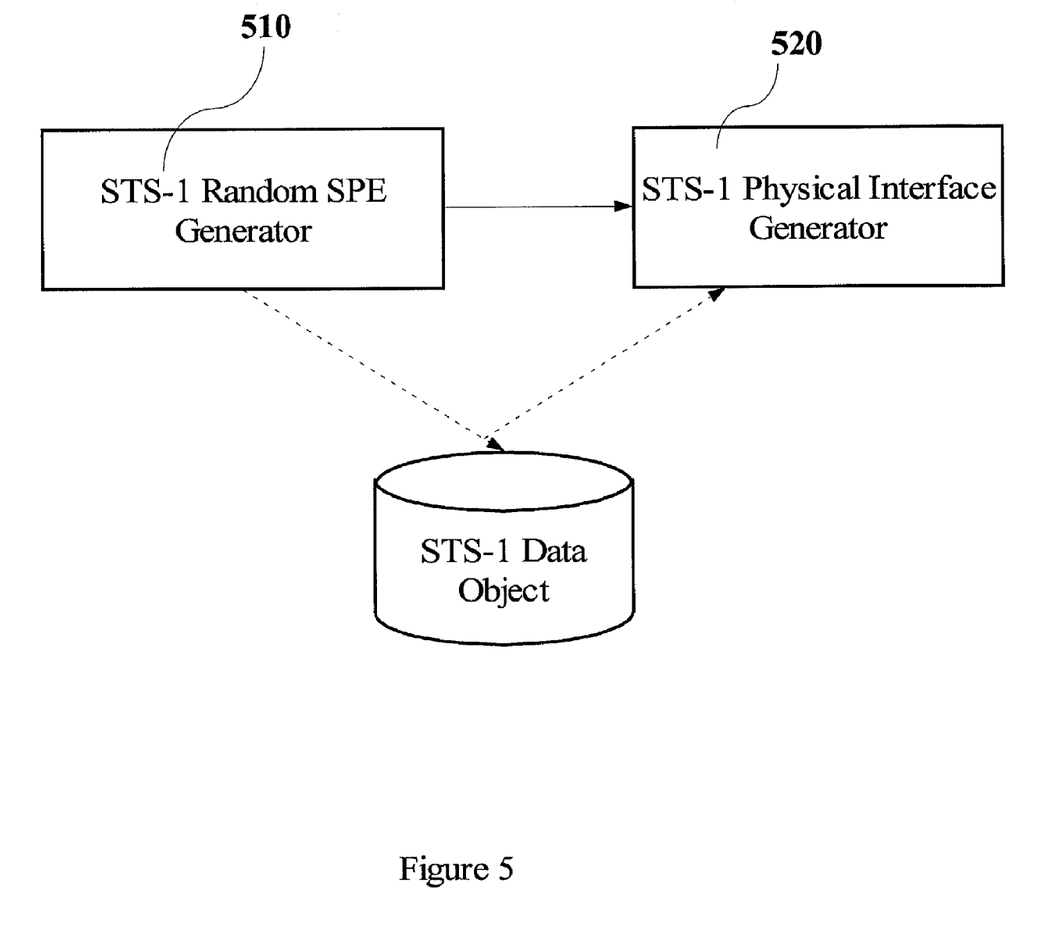
FIG. 5—An STS-1 verification component.

FIGS. 5 and 6 show conceptually how the present invention can be used to utilize previous developed verification components. Specifically FIGS. 5 and 6 shows an embodiment of the present invention where several instances of an existing SONET STS-1 frame can be combined to generate verification components for testing a device under verification requiring STS-3 frames. Assume an STS-1 verification component, as shown in FIG. 5, has been previously developed for verification of predecessor design. This component will generate random STS-1 payloads 510 and generate STS-1 frames 520. This component can then reside in a library of verification components which can be utilized by other verification engineers on subsequent projects.

Figure 6A:
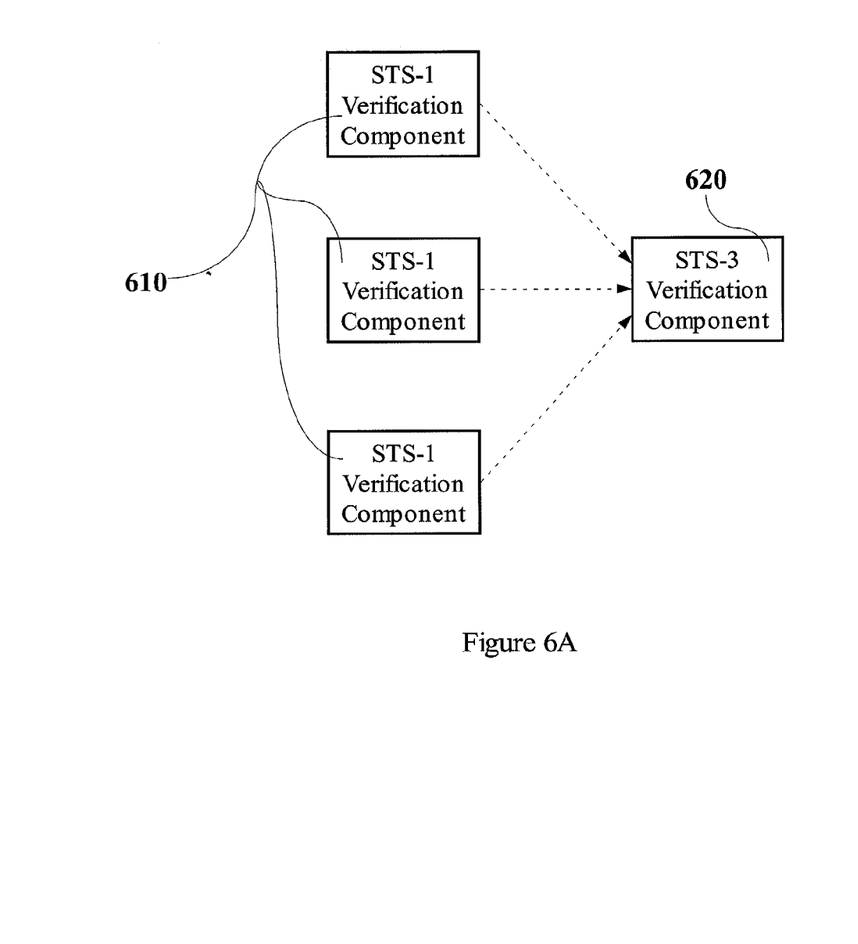
FIG. 6—Stacking STS-1 components to generate other components.
Figure 6B:
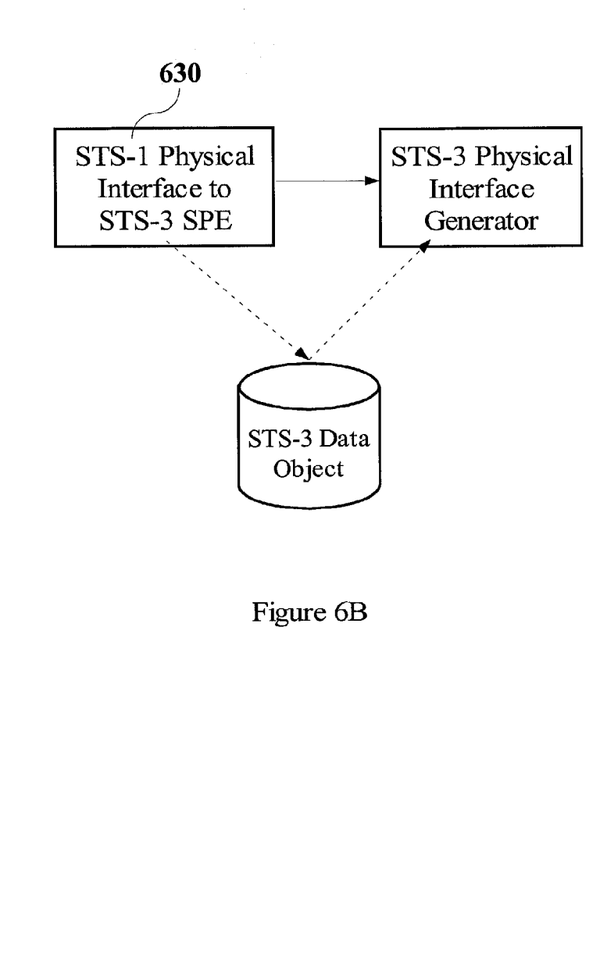
Figure 7A:
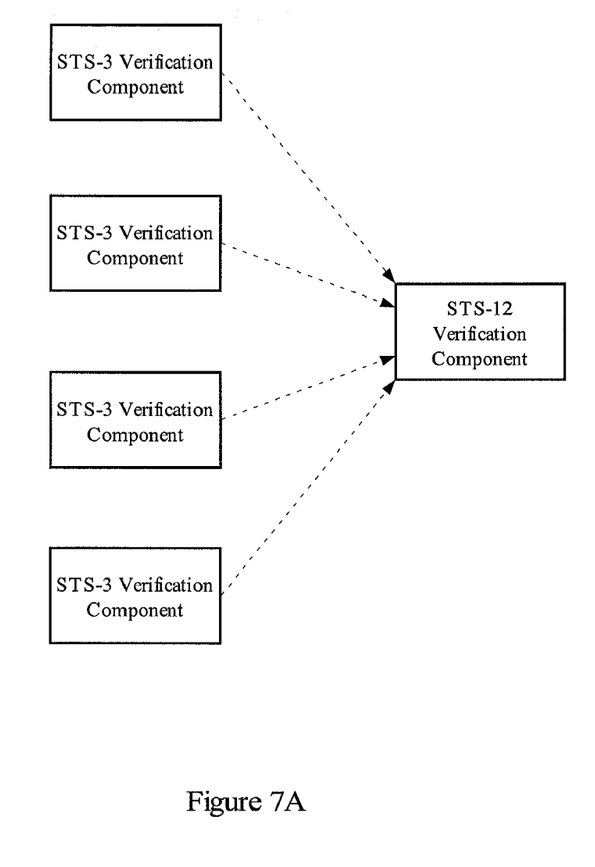
FIG. 7—Stacking STS3 components to generate an STS-12 component.
Figure 7B:
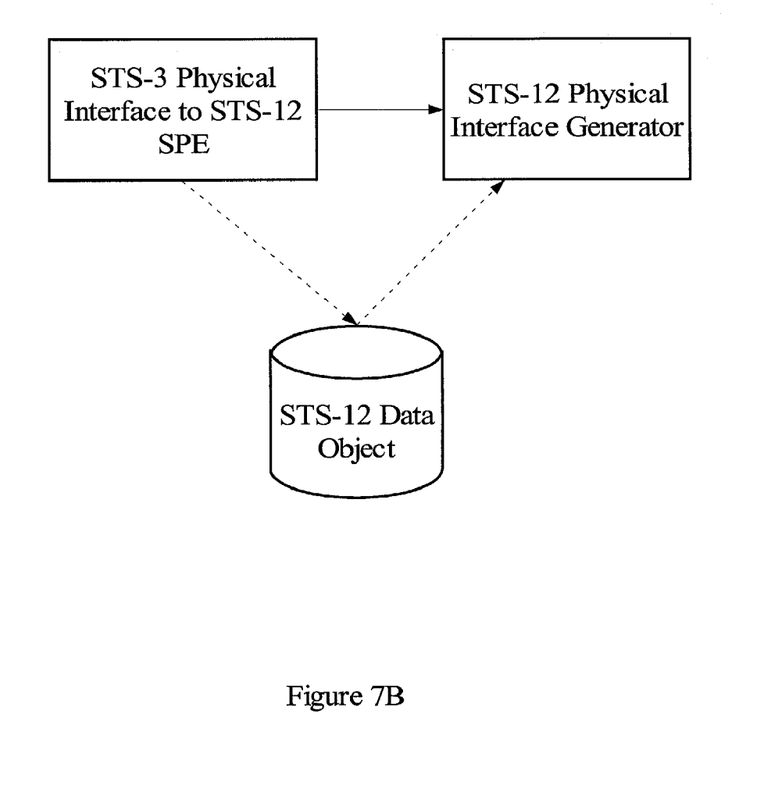

FIG. 6A shows 3 STS-1 610 components of FIG. 5 which can be combined to provide an STS-3 verification component with data driven by the payloads of the 3 STS-1 frames. FIG. 6B shows the lower level components of the STS-3 verification component 620 of FIG. 6A. In this embodiment, the first subcomponent of FIG. 6B 630 is an STS-1 physical interface to STS-3 SPE converter. The details of the transfer of data between verification components will be described subsequently. The STS-3 verification component can itself be contained in the library of components. In turn, this will facilitate development of fast rate SONET testing. As shown in FIGS. 7A and 7B, four of the STS-3 verification components could be combined (FIG. 7A) to feed a subsequently developed STS-12 (FIG. 7B) verification component.

Data Transfers

Once the data objects have been established, mailboxes are the mechanism utilized by verification components to facilitate the transfer of these data objects. Therefore, each verification component may have associated with it one or more mailboxes. In one embodiment of the present invention, the mailbox is associated with the component that receives the data object. In this embodiment, the transmitter will contain a reference to the corresponding receiving mailbox. In another embodiment of the present invention, both the transmitter and receiver components contain mailboxes.

Figure 8:
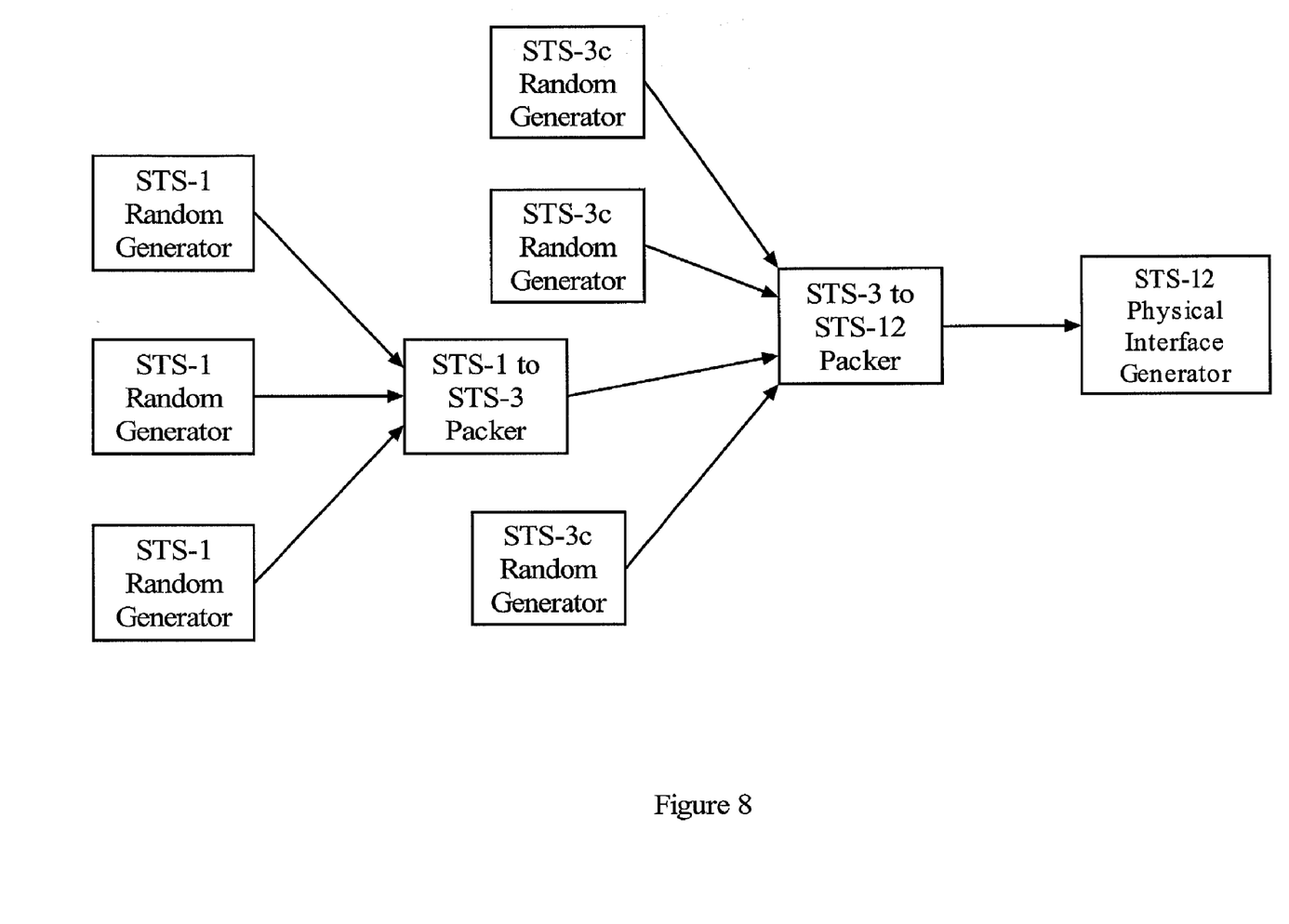
FIG. 8—Embodiment showing stacking of two levels to achieve an STS-12 component.

FIG. 8 shows a diagram of an embodiment of the present invention wherein 3 STS-1 SPE are combined into a single payload for a STS-3 component. These are then combined with 3 STS-3c SPE payloads to form an STS-12 payload. This STS-12 payload is then provided with a physical interface to generate STS-12 frames.

Figure 9:
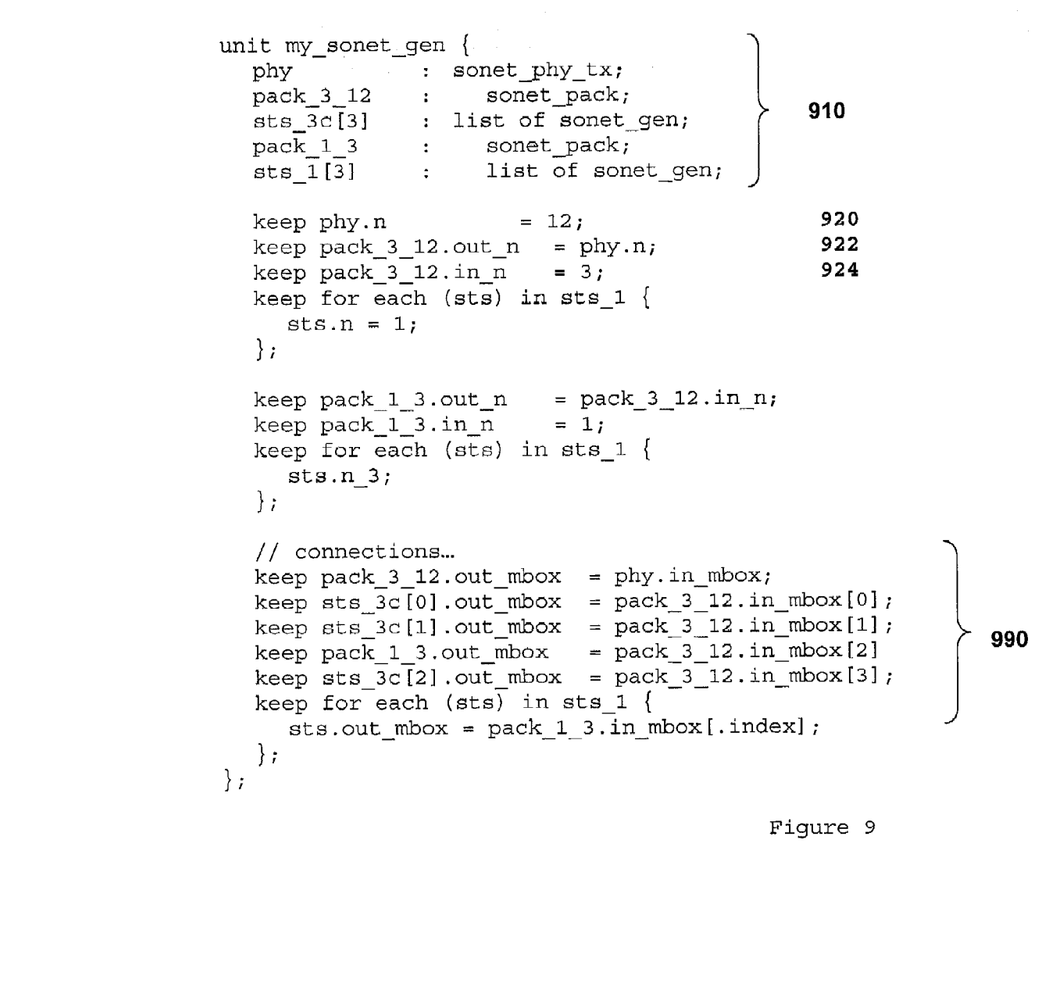
FIG. 9—A sample configuration for a verification using multiple STS level components.

FIG. 9 shows an embodiment of a generation configuration for such a verification component in the verification language "e". "e" is a proprietary language used by the Specman Elite test bench automation software from Verisity. Specman Elite is one of a number of commercially available test bench automation packages. Section 910 of the generation configuration shows the declaration of the constituent verification elements that will make up the SONET generator of FIG. 8. These components are specific SONET components. For example, the sonet_phy_tx component is a component that describes the physical interface for a SONET channel. By setting the n field of this component to 12 920 we define it as a 12 channel physical interface. The sonet_pack type is a component that will pack input SONET channels into faster rate SONET channels. In this example, the out_n 922 and in_n 924 have sizes of 12 and 3 respectively. These are the sizes of the output and input SONET frames respectively. sonet_gen is a component that is a random SONET generation component. sts_3c and sts_1 are lists of such types providing sts3c and sts1 frames respectively. To provide the 3 sts_1 components required to make the sts_3 channel for the present example, the list is for sts_1 is of size three. The sts_3c list is also of size three. This is to fill out the sts_12 channel when combined with the other sts_3 channel. Finally, in this example, the in_box and out_box fields of each component are connected properly as shown in code section 990.

The in_box and out_box are fields in each component of the present invention that point to a mailbox. In one embodiment of the present invention, the receiving component contains a mailbox. In this embodiment, the mailbox contains a queue. A queue is a list of data objects that are pending transfer to the component containing the mailbox. In another embodiment of the present invention, there will be two events event_empty and event_ready. In the former case, the component will emit the event when the queue becomes empty. Similarly, the component will issue the later event whenever a new set of data objects have been added to the mailbox and is now ready for transfer.

Other mailbox features exist that depend on the type of verification component to which the mailbox is attached. For example, in one embodiment of the present invention, all physical interface stimulus units will have a data object mailbox, a transmitting data object and a list of errors. The data object mailbox will contain a list of data objects that are waiting to be transmitted on the physical interface. In this embodiment, the transmitting data object is the data object that is currently being transmitted over the physical interface. Finally, the list of errors is a list of errors that are to be injected into each data object transmitted. In another embodiment, the list of errors may contain configuration information about what characteristics are required of data objects before the errors will be injected.

In one embodiment of the present invention, the physical interface response units contain a mailbox field, a data object field and an error list field. The mailbox field contains a reference to a mailbox where to put data object when the object is completely received. The data object field is for the object currently being received. In the case of an active response unit, there is a field that contains a list of errors. This can perform functions similar to the functions provided by the physical interface stimulus units.

Data object packers will have fields specific to them as well. In one embodiment of the present invention, there will be a list of data objects to be packed on the output channel, the current object being packed and a reference to a data object mailbox. This later element would be a reference to the receiving devices mailbox that is to receive the packed item when the packing is complete. Similarly, data object unpackers will have a list of objects to unpack, the object currently being unpacked and a list of references to output channels where output objects are moved once completely unpacked.

CONCLUSION

Thus, it can be seen from the above descriptions, a novel method of conducting transactional-based verification is disclosed. The method disclosed includes specification of interoperable verification components of various function types, which in turn leads to specification of higher level verification components formed from stacked pre-existing verification components.

What is claimed is:

1. A machine readable storage medium having stored therein a library of data structures defining reusable verification components for use by a plurality of programming instructions to enable the plurality of programming instructions to perform a method during verification of a design, the method comprising, generating data objects, applying data objects to said design under verification, monitoring a physical interface unit on the design, extracting data objects from said physical interface unit, and checking the extracted data objects;
wherein the reusable verification components comprise one or more physical interface units;
wherein the one or more physical interface units inject zero or more errors into the circuit design of the design under verification; and
wherein a set of reusable verification components can be stacked into a hierarchical verification component: and
wherein a set of reusable verification components can be organized into a flow that generates an input that matches the input specification of the design and receives an output that matches the output specification of the design.

2. The machine readable storage medium of claim 1 wherein the generation of data objects is performed under constraints from a user.

3. The machine readable storage medium of claim 1 wherein the monitoring a physical interface further comprises reporting timing violations.

4. The machine readable storage medium of claim 1 wherein the monitoring a physical interface further comprises reporting protocol violations.

5. The machine readable storage medium of claim 1 wherein the reusable verification components comprise one or more physical interface response units.

6. The machine readable storage medium of claim 5 wherein the response unit is an active response unit.

7. The machine readable storage medium of claim 5 wherein the response unit is a passive response unit.

8. The machine readable storage medium of claim 1 wherein the verification component comprises data object packing units.

9. The machine readable storage medium of claim 1 wherein the reusable verification components comprise a data object unpacking unit.

10. A method of generating verification components used for verifying a design, the method comprising:
receiving a configuration file containing configuration information;
based at least on the configuration information, choosing a set of reusable verification components from a database; and
generating a complete verification model for the circuit design of the design under verification, the complete verification model derived from the set of reusable verification components, wherein the complete verification model comprises at lease one of a physical interface stimulus unit and a physical interface response unit;
wherein the one or more physical interface stimulus units inject zero or more errors into the circuit design of the design under verification; and
wherein a set of reusable verification components can be stacked into a hierarchical verification component; and
wherein a set of reusable verification components can be organized into a flow that generates an input that matches the input specification of the design and receives an output that matches the output specification of the design.

11. The method of claim 10 wherein the complete verification model comprises one or more of a data object packing unit and a data object unpacking unit.

12. An apparatus comprising:
a machine readable medium having stored therein a library of data structures defining reusable verification components for use by a plurality of programming instructions to enable the plurality of programming instructions to perform a method, during verification of a design, the method comprising, generating data objects, applying data objects to said circuit design under verification, monitoring a physical interface unit on the circuit design, extracting data objects from said physical interface unit, and checking the extracted data objects, wherein the reusable verification components comprise one or more physical interface stimulus units, wherein the one or more physical interface stimulus units inject zero or more errors into the circuit design under verification, wherein a set of reusable verification components can be stacked into a hierarchical verification component, and wherein a set of reusable verification components can be organized into a flow that generates an input that matches the input specification of the design and receives an output that matches the output specification of the design; and a processor coupled to the machine readable medium to execute the programming instructions.

13. The apparatus of claim 12 wherein the generation of data objects is performed under constraints from a user.

14. The apparatus of claim 12 wherein the monitoring a physical interface further comprises reporting timing violations.

15. The apparatus of claim 12 wherein the monitoring a physical interface further comprises reporting protocol violations.

16. The apparatus of claim 12 wherein the reusable verification components comprise one or more data object packing units.

17. An apparatus comprising:

a machine readable medium having stored therein a plurality of programming instructions designed to operate the apparatus to enable the apparatus to: receive a configuration file containing configuration information;

based at lease on the configuration information, choose a set of reusable verification components from a database;

generate a complete verification model for a design under verification, the complete verification model derived from the set of reusable verification components, wherein the complete verification model comprises at least one of a physical interface stimulus unit and a physical interface response unit, wherein the at least one physical interface stimulus unit injects zero or more errors into the design under verification, wherein a set of reusable verification components can be stacked into a hierarchical verification component, and wherein a set of reusable verification components can be organized into a flow that generates an input that matches the input specification of the design and receives an output that matches the output specification of the design; and a processor coupled to the machine readable medium to execute the programming instructions.

18. The apparatus of claim 17 wherein the complete verification model comprises one or more of a data object packing unit and a data object unpacking unit.

* * * * *